(12) United States Patent
Choi

(10) Patent No.: US 8,743,620 B2
(45) Date of Patent: Jun. 3, 2014

(54) NONVOLATILE MEMORY DEVICE AND PROGRAM VERIFY METHOD THEREOF

(75) Inventor: Won Yeol Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 279 days.

(21) Appl. No.: 13/399,561

(22) Filed: Feb. 17, 2012

(65) Prior Publication Data

US 2012/0213008 A1   Aug. 23, 2012

(30) Foreign Application Priority Data

Feb. 18, 2011   (KR) .................. 10-2011-0014445

(51) Int. Cl.
*G11C 16/06* (2006.01)

(52) U.S. Cl.
USPC ................................ 365/185.22; 365/185.21

(58) Field of Classification Search
USPC ........................................ 365/185.22, 185.21
See application file for complete search history.

(56) References Cited

U.S. PATENT DOCUMENTS

| 6,044,013 A * | 3/2000 | Tanaka et al. ............. 365/185.22 |
| 2003/0151947 A1* | 8/2003 | Miwa et al. .............. 365/185.03 |

FOREIGN PATENT DOCUMENTS

| KR | 1020100133618 A | 12/2010 |
| KR | 1020110001591 A | 1/2011 |

* cited by examiner

*Primary Examiner* — Tuan T. Nguyen
(74) *Attorney, Agent, or Firm* — William Park & Associates Patent Ltd.

(57) ABSTRACT

A program verify method of the nonvolatile memory device includes supplying a first program verify voltage to a word line coupled to memory cells of a memory cell array, sensing a voltage of a bit line coupled to the memory cells in response to a first sense signal, supplying a second program verify voltage higher than the first program verify voltage to the word line, and sensing a voltage of the bit line in response to a second sense signal having a lower voltage level than the first sense signal.

14 Claims, 5 Drawing Sheets

NONVOLATILE MEMORY DEVICE AND PROGRAM VERIFY METHOD THEREOF

CROSS-REFERENCE TO RELATED APPLICATION

The present application claims priority under priority 35 U.S.C 119(a) to Korean patent application number 10-2011-0014445 filed on Feb. 18, 2011, in the Korean Intellectual Property Office the entire disclosure of which is incorporated by reference herein in its entirety.

BACKGROUND

1. Technical Field

Example embodiments relate to a nonvolatile memory device and a program verify method thereof and, more particularly, to a nonvolatile memory device and a program verify method thereof, which are capable of improving a distribution of threshold voltages of memory cells.

2. Related Art

A semiconductor memory device is a memory device in which data can be stored and from which stored data can be read. Semiconductor memory devices are chiefly divided into volatile memory devices, whose data stored therein is erased when power is off; and nonvolatile memory devices, whose data stored therein is not erased although power is off. From among the nonvolatile memory devices, flash memory is being widely used in computers, memory cards, etc. because it is capable of electrically erasing bundles of data of memory cells.

Flash memory is divided into NOR-type flash memory and NAND-type flash memory according to a coupling state between memory cells and a bit line. The NOR-type flash memory has two or more cell transistors coupled in parallel to one bit line, stores data using a channel hot electron method, and erases data using a Fowler-Nordheim (F-N) tunneling method. The NAND-type flash memory has two or more cell transistors coupled in series to one bit line and stores or erases data using the F-N tunneling method. In general, the NOR-type flash memory requires higher current consumption, which hinders a high integration of the flash memory. The NOR-type flash memory, however, is superior in terms of having a higher speed. The NAND-type flash memory is able to achieve higher integration because it uses lower cell current than the NOR-type flash memory.

In a program verify method of the nonvolatile memory device, a plurality of program verify operations is consecutively performed by skipping a bit line precharge time during the program verify operation in order to reduce the time taken to perform the program verify operations. If the program verify method is used, however, verify time points are different depending on the program states of memory cells. In this case, there is a problem in that a distribution of the threshold voltages of the memory cells is widened because a margin differs depending on a difference in a time of an evaluation interval when a page buffer detects the potential of a bit line.

BRIEF SUMMARY

Example embodiments relate to a nonvolatile memory device and a program verify method thereof, which can prevent an increase in the width of a threshold voltage distribution by regularly maintaining a bit line sense current, in such a way as to supply a bit line sense signal having a gradually lower voltage level whenever program verify voltages are changed when the threshold voltages of a memory cell are sensed by sequentially supplying the program verify voltages in program verify operations.

A nonvolatile memory device according to an aspect of the present disclosure includes a memory cell array configured to include a plurality of memory cells, a voltage supply unit configured to supply operating voltages to a word line of the memory cell array, a page buffer unit coupled to the plurality of memory cells through a bit line, and a controller configured to control the operations of the page buffer unit and the voltage supply unit, wherein the controller performs control so that the voltage supply unit sequentially outputs a plurality of program verify voltages to the memory cell array when program verify operations are performed and generates a bit line sense signal so that the page buffer unit senses a voltage of the bit line, and the bit line sense signal having a gradually lower voltage level is generated whenever the program verify voltages are changed.

A program verify method of the nonvolatile memory device according to an aspect of this disclosure includes supplying a first program verify voltage to a word line coupled to memory cells of a memory cell array, sensing a voltage of a bit line coupled to the memory cells in response to a first sense signal, supplying a second program verify voltage higher than the first program verify voltage to the word line, and sensing a voltage of the bit line in response to a second sense signal having a lower voltage level than the first sense signal.

In an other embodiment, a program verify method of a nonvolatile memory device includes supplying a first program verify voltage to a word line coupled to memory cells of a memory cell array, evaluating a voltage of a bit line coupled to the memory cells according to threshold voltages of the memory cells during a first interval, sensing the voltage of the bit line coupled to the memory cells in response to a first sense signal, supplying a second program verify voltage higher than the first program verify voltage to the word line, evaluating a voltage of the bit line according to threshold voltages of the memory cells during a second interval shorter than the first interval, and sensing the voltage of the bit line coupled to the memory cells in response to a second sense signal.

DESCRIPTION OF EMBODIMENTS

Hereinafter, some example embodiments of the present disclosure will be described in detail with reference to the accompanying drawings. The figures are provided to allow those having ordinary skill in the art to understand the scope of the embodiments of the disclosure.

Figure 1A:
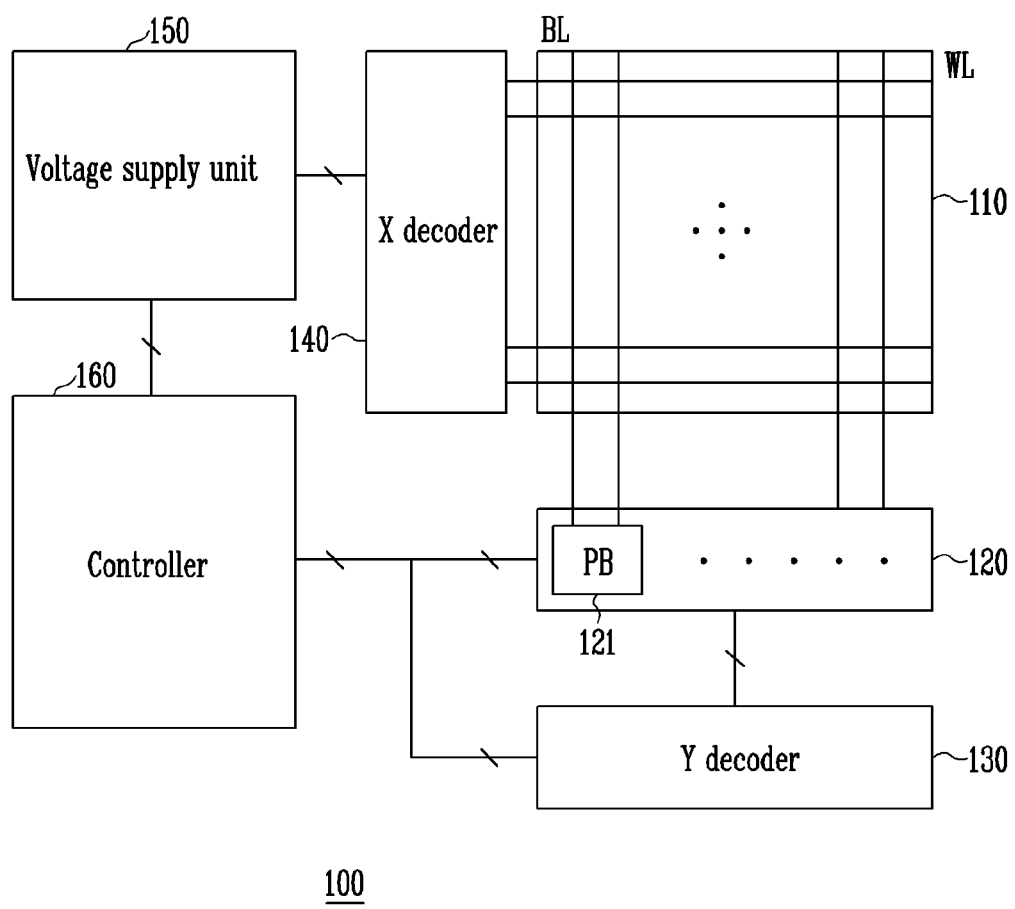
FIG. 1A is a block diagram showing the structure of a flash memory device.

FIG. 1A is a block diagram showing a structure of a flash memory device.

Referring to FIG. 1A, the flash memory device 100 includes a memory cell array 110, a page buffer unit 120, a Y decoder 130, an X decoder 140, a voltage supply unit 150, and a controller 160.

The memory cell array 110 includes memory cells for storing data. The memory cells are coupled to word lines WL and bit lines BL. The page buffer unit 120 includes a plurality of page buffers 121 coupled to the bit lines BL of the memory cell array 110.

The Y decoder 130 provides a data input/output path to the page buffers of the page buffer unit 120 in response to a control signal of the controller 160. Furthermore, the X decoder 150 selects a word line of the memory cell array 110 in response to a control signal of the controller 160.

The voltage supply unit 150 generates operating voltages under control of the controller 160 and provides the operating voltages to the word lines WL of the memory cell array 110 through the X decoder 140 or to the page buffers of the page buffer unit 120.

The voltage supply unit 150 generates a program voltage according to a start voltage and a step voltage using an incremental step pulse programming (ISPP) method. The start voltage and the step voltage may be changed in various ways by the controller 160.

The controller 160 controls the memory cell array 110, the page buffer unit 120, the Y decoder 130, the X decoder 140, and the voltage supply unit 150.

Figure 1B:
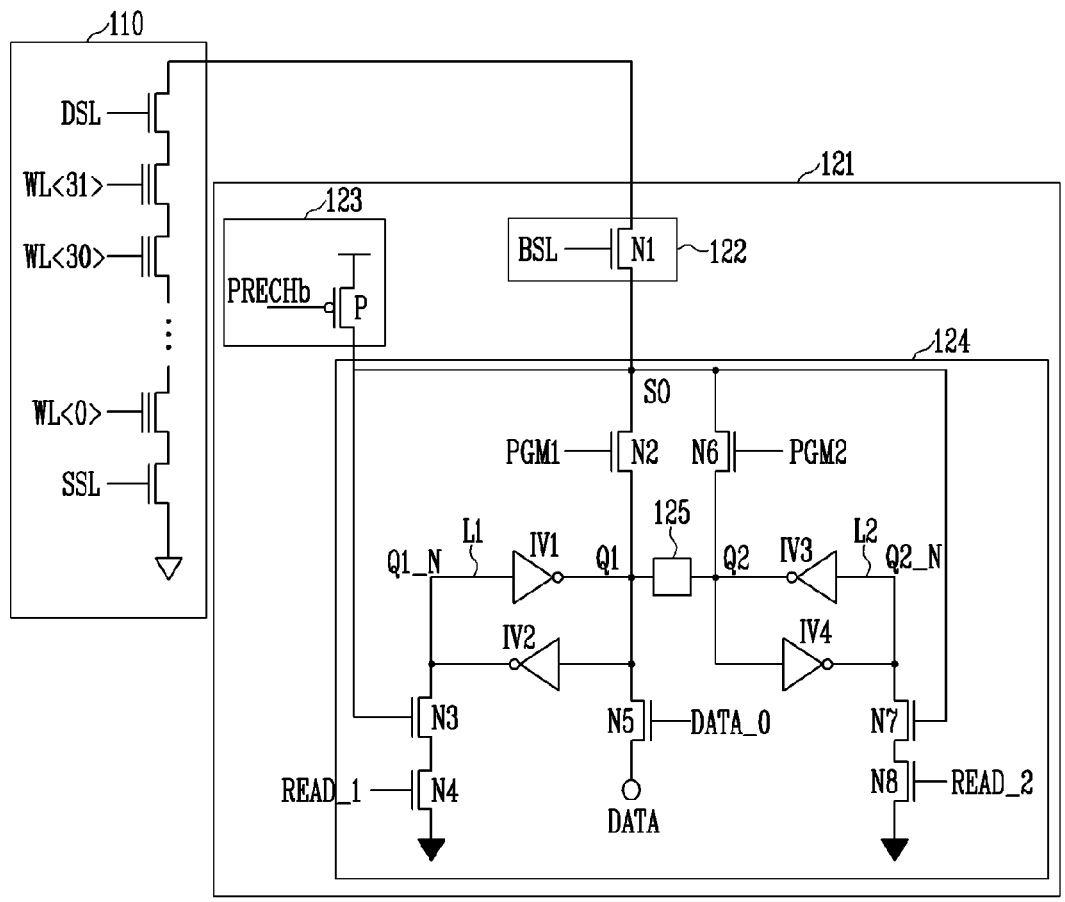
FIG. 1B is a circuit diagram showing part of a page buffer shown in FIG. 1A.

FIG. 1B is a circuit diagram showing part of one of the page buffers shown in FIG. 1A.

Referring to FIG. 1B, each page buffer 121 of the page buffer unit 120 includes a bit line select unit 122, a precharge unit 123, a latch unit 124, and a verify unit 125.

The bit line select unit 122 couples a bit line BL and a sense node SO in response to a control signal. The bit line BL may also be coupled to a memory cell string of the memory cell array 110. The bit line select unit 122 may control a sense margin in an evaluation interval by changing the voltage level and enable timing of the control signal. In general, the bit line select unit 122 couples one bit line—selected from among at least a pair of the bit lines including an even bit line and an odd bit line—with the sense node SO in response to the control signal. In an embodiment of this disclosure, only one bit line is illustrated as coupled to the sense node SO, for the sake of convenience.

The precharge unit 123 precharges the sense node SO. The latch unit 124 stores data to be programmed into memory cells and transfers the stored data through the sense node SO or reads data stored in memory cells through the sense node SO and externally outputs the read data.

The verify unit 125 determines whether memory cells have been programmed based on a state of data stored in the latch unit 124 and generates a relevant verify signal.

The bit line select unit 122 includes a first NMOS transistor N1. The precharge unit 123 includes a PMOS transistor P. The latch unit 124 includes second to eighth NMOS transistors N2 to N8 and first to fourth inverters IV1 to IV4.

The first NMOS transistor N1 of the bit line select unit 122 is coupled between the bit line and the sense node SO and is operated in response to a bit line select signal BSL.

The PMOS transistor P supplies a power source voltage to the sense node SO in response to a precharge control signal PRECHb. The second NMOS transistor N2 is coupled between the sense node SO and a node Q1. A first program signal PGM1 is inputted to a gate of the second NMOS transistor N2.

The third and the fourth NMOS transistors N3 and N4 are coupled in series between a node Q1_N and a ground node. A gate of the third NMOS transistor N3 is coupled to the sense node SO. A first read signal READ_1 is inputted to a gate of the fourth NMOS transistor N4.

The fifth NMOS transistor N5 is coupled between the node Q1 and a data output node DATA. A data output signal DATA_O is inputted to the gate of the fifth NMOS transistor N5. The first and the second inverters IV1 and IV2 form a first latch L1, and the inverters IV1 and IV2 are coupled between the node Q1 and the node Q1_N.

The sixth NMOS transistor N6 is coupled between the sense node SO and a node Q2. A second program signal PGM2 is inputted to a gate of the sixth NMOS transistor N6. The seventh and the eighth NMOS transistors N7 and N8 are coupled in series between a node Q2_N and the ground node. A gate of the seventh NMOS transistor N7 is coupled to the sense node SO. A second read signal READ_2 is inputted to a gate of the eighth NMOS transistor N8.

The third and the fourth inverters IV3 and IV4 form a second latch L2, and the inverters IV3 and IV4 are coupled between the node Q2 and the node Q2_N.

Meanwhile, each of the bit lines BL of the memory cell array 110 is coupled to the memory cell string.

The memory cell string includes a drain select transistor, a source select transistor, and a plurality of the memory cells coupled in series between the drain select transistor and the source select transistor. Here, the bit line is coupled to a drain of the drain select transistor.

Word lines WL<0> to WL<31> are coupled to the respective memory cells of the memory cell string. A drain select line DSL is coupled to a gate of the drain select transistor. Furthermore, a source select line SSL is coupled to a gate of the source select transistor.

A recent flash memory device employs a double verify method in order to narrow a distribution of the threshold voltages of memory cells through a program verify operation.

The double verify method is described with reference to the page buffer 121 of FIG. 1B.

First, a program operation for memory cells is performed by supplying a program pulse. In order to perform a program verify operation, the precharge unit 123 precharges the sense node SO to a power source voltage. Next, the bit line is precharged in response to the bit line select signal BSL having a first voltage level V1.

Next, the drain select transistor and the source select transistor are turned on in response to the drain select signal DSL and the source select signal SSL having a high level. Here, a first program verify voltage is supplied to a word line coupled to memory cells selected for a first program verify operation, and a pass voltage is supplied to the remaining word lines.

Next, there is an evaluation interval in which a bit line voltage is shifted according to a program state of the memory cells for a specific time. In this interval, the first NMOS transistor N1 is turned off in response to the bit line select signal BSL of 0 V.

If the memory cells have been programmed, it means that threshold voltages of the memory cells are higher than the first program verify voltage. Accordingly, the memory cells remain turned off, and the bit line maintains the precharge voltage.

If the memory cells have not been programmed, it means that the threshold voltages of the memory cells are lower than the first program verify voltage. Accordingly, the memory cells are turned off, and the voltage of the precharged bit line is discharged through the source select transistor.

After the evaluation interval, a voltage of the bit line is sensed in response to the bit line select signal BSL having a second voltage level V2 and stored in the latch unit 124. Next, the stored voltage is read using the node Q2 of the latch unit 124.

Next, after the voltage precharged in the bit line is discharged and data stored in the page buffer 121 is reset, a second program verify operation is performed. The second program verify operation is the same as the first program verify operation in terms of the operation of precharging the bit line, the evaluation time, and the operation of sensing the voltage of the bit line except that a second program verify voltage higher than the first program verify voltage is supplied to the word line coupled to the memory cells.

The double verify operation is performed by classifying memory cells to be programmed into three types according to the program speeds of the memory cells and applying different program methods to the three types of the memory cells. That is, the memory cells are classified into memory cells programmed at a fast speed, memory cells programmed at a middle speed, and memory cells programmed at a slow speed, and different program voltages are controlled for the three types of the memory cells.

More specifically, as a result of the double verify operation, a subsequent program operation is not performed on the memory cells programmed at a fast speed, a subsequent program operation using a step voltage smaller than a current ISPP voltage is performed on the memory cells programmed at a middle speed, and a subsequent program operation using a step voltage greater than a current ISPP voltage is performed on the memory cells programmed at a slow speed.

Figure 2:
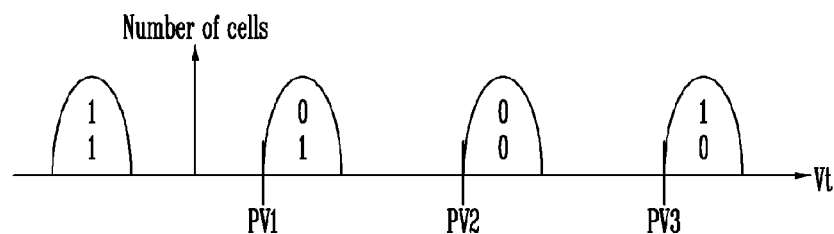
FIG. 2 shows threshold voltage distributions illustrating data values according to threshold voltage distributions of a known nonvolatile memory device.

FIG. 2 shows threshold voltage distributions illustrating data values according to the threshold voltage distributions of a known nonvolatile memory device.

Referring to FIG. 2, the known nonvolatile memory device has a plurality of threshold voltage distributions A to D depending on program states, and the known nonvolatile memory device has data values corresponding to the respective threshold voltage distributions. For example, the threshold voltage distribution C corresponds to a data value "00". FIGS. 3A to 3E show waveforms of program verify voltages supplied depending on program states of memory cells when a program verify operation is performed according to an embodiment of this disclosure.

Referring to FIGS. 3A to 3E, memory cells are verified by selectively performing a plurality of program verify operations according to a program operation.

Figure 3A:
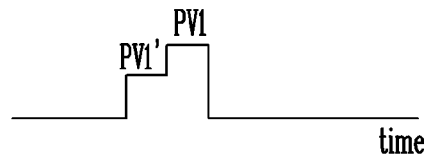
FIGS. 3A to 3E show waveforms of program verify voltages supplied depending on program states of memory cells when a program verify operation is performed according to an embodiment of this disclosure.
Figure 3B:
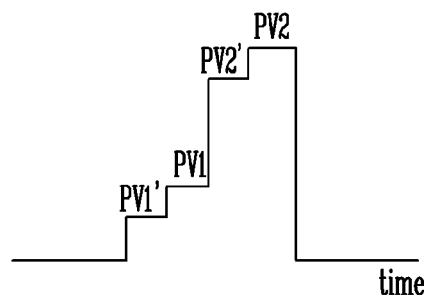
Figure 3C:
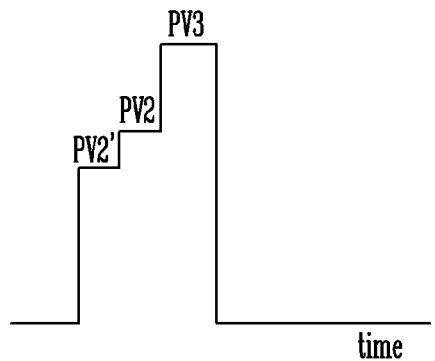
Figure 3D:
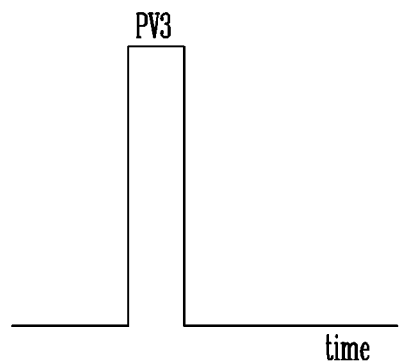
Figure 3E:
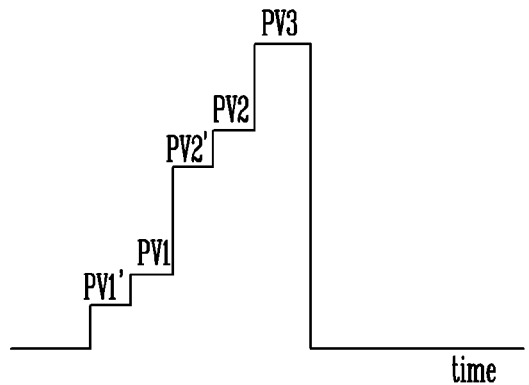

For example, if the memory cells are to be programmed from a state A ('11') (i.e., an erase state) to a state B ('01'), program verify operations may be performed by using program verify voltages shown in FIGS. 3A, 3B, and 3E. In the program verify operations using the program verify voltages shown in FIGS. 3A, 3B, and 3E, voltages of the bit lines are sensed at the same time by using the page buffer. Furthermore, the time taken to perform the program verify operations may be reduced by consecutively supplying first program verify voltages PV1' and PV1, second program verify voltages PV2' and PV2, and a third program verify voltage PV3. That is, after the first program verify voltages PV1' and PV1 are supplied, a bit line discharge interval and a bit line precharge interval are skipped, the second program verify voltages PV2' and PV2 are supplied, the second program verify voltages PV2' and PV2 are supplied, the bit line precharge interval is skipped, and the third program verify voltage PV3 is supplied.

In some embodiments, if the memory cells are to be programmed from the state A ('11') to the state B ('01'), any one of the program verify operations using the program verify voltages shown in FIGS. 3A, 3B, and 3E may be performed. The program verify operations have the same evaluation interval and sense timing. Accordingly, a sense margin is constant.

If the memory cells are to be programmed from the state A ('11') to the state C ('00'), the program verify operation (FIG. 3A) for verifying the state B ('01'), the program verify operation (FIG. 3B) for verifying the state B ('01') and the state C ('00'), and the program verify operation (FIG. 3C) for verifying the state C ('00') and the state D ('10') are performed. If data is randomly inputted, the program verify operation using the verify voltages shown in FIG. 3E is performed.

If the memory cells are to be programmed from the state A ('11') to the state D ('10'), the program verify operations using the program verify voltages shown in FIGS. 3C, 3D, and 3E may be performed. The above-described program verify operations, however, are different in a point of time at which the bit line is sensed and in an interval where the bit line is evaluated. For this reason, there is a problem in that a distribution of the threshold voltages of memory cells is widened because points of time at which the threshold voltages are sensed are different.

Figure 4:
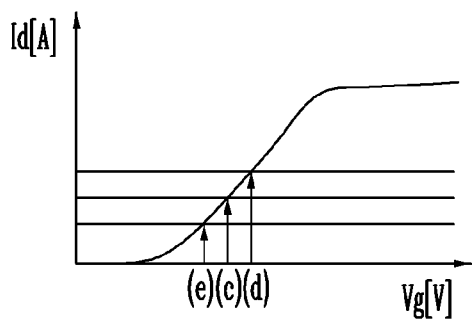
FIG. 4 is a graph showing a relationship between a gate voltage, supplied to a transistor of a bit line select unit, and current flowing through the transistor.

FIG. 4 is a graph showing a relationship between a gate voltage, supplied to the transistor of the bit line select unit 122, and current flowing through the transistor.

In the program verify operations shown in FIGS. 3A to 3E, the program verify voltages are the same, but the points of time at which the program verify voltages are supplied are different as shown in FIG. 4. Consequently, sensed currents are different as shown in FIG. 5.

Figure 5A:
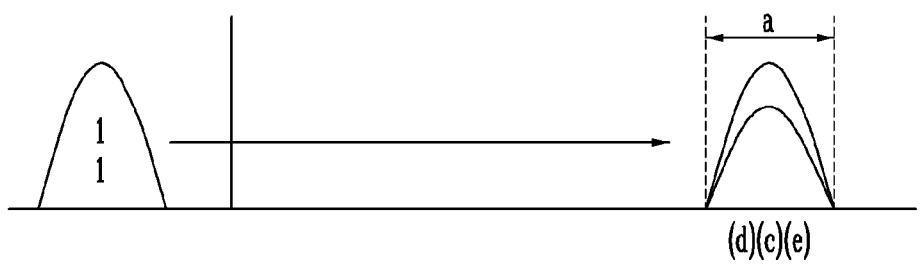
FIGS. 5A and 5B shows threshold voltage distributions illustrating a comparison between shifts in threshold voltage distributions of program verify and read operations when memory cells are programmed from a first state A to a fourth state D.
Figure 5B:
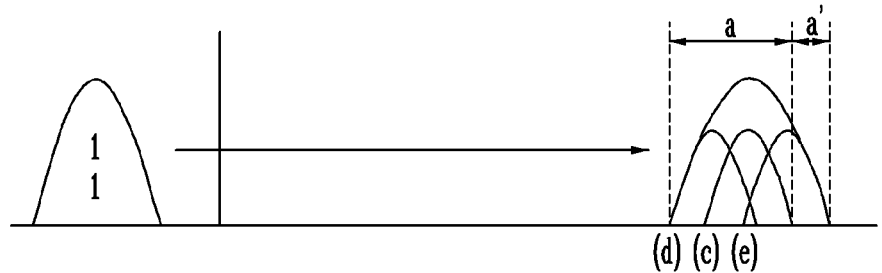

FIGS. 5A and 5B shows threshold voltage distributions illustrating a comparison between shifts in the threshold voltage distributions in program verify and read operations when memory cells are programmed from the first state A to the fourth state D.

Referring to FIGS. 5A and 5B, if the memory cells are to be programmed from the state A ('11'), (i.e., the erase state) to the state C ('00') or to the state D ('10'), different program verify operations are performed. For this reason, a point of time at which the bit line is sensed is changed in the program verify operation, and a sensed current value is different. Consequently, a distribution of the threshold voltages of the memory cells may be widened in the read operation.

Figure 6A:
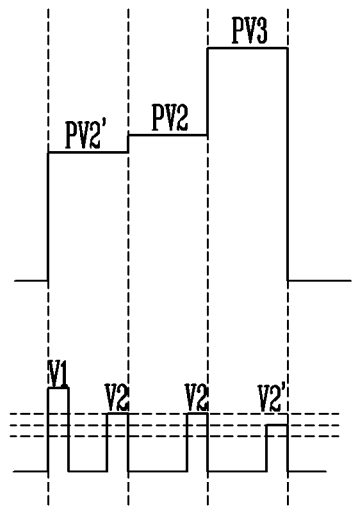
FIGS. 6A, 6B, and 6C are waveforms illustrating points of time at which bit line select voltages are supplied when program verify voltages are used, and voltage levels of signals according to an embodiment of this disclosure.
Figure 6B:
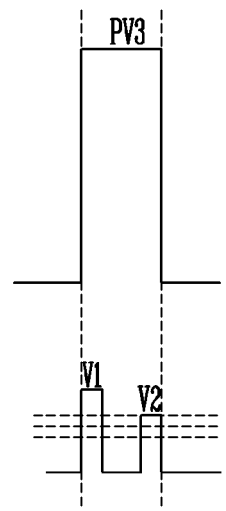
Figure 6C:
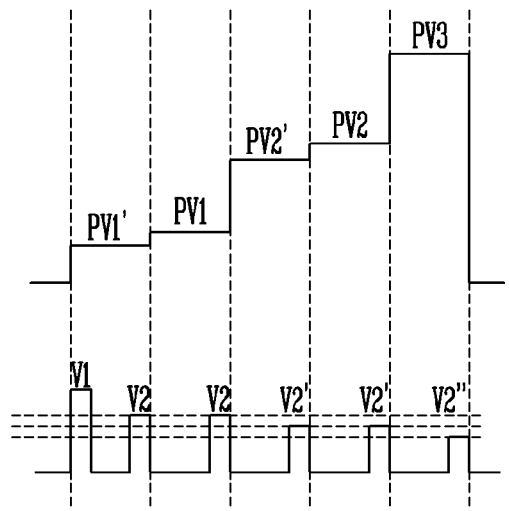

FIGS. 6A, 6B, and 6C are waveforms illustrating points of time at which bit line select voltages are supplied when program verify voltages are used, and voltage levels of signals according to an embodiment of this disclosure.

Program verify operations according to an embodiment of this disclosure are described in detail with reference to FIGS. 1B, 6A, 6B, and 6C.

A double verify method of consecutively supplying second program verify voltages PV2' and PV2 and a third program verify voltage PV3 is described with reference to FIG. 6A.

First, when the precharge signal PRECHb of a low level is supplied to the precharge unit 123, the sense node SO is precharged to a high level. Furthermore, when the bit line select signal BSL having a voltage level V1 is supplied for a specific time, the bit line coupled to the memory cell array 110 through the sense node SO is precharged. Here, the second program verify voltage PV2' is supplied to the word line WL<30> coupled to selected memory cells (e.g., memory cells coupled to the word line WL<30>).

Next, the bit line select signal BSL shifts to a low level, and thus the connection between the sense node SO and the bit line is cut off. The memory cell array 110 is coupled to the ground voltage Vss in response to the source select signal SSL of a high level. Thus, the selected memory cells (e.g., the memory cells coupled to the word line WL<30>) are turned on or turned off in response to the second program verify voltage PV2', so that a voltage of the bit line having a high level is discharged or maintained. After a specific evaluation interval elapses, the bit line select signal BSL having a voltage level V2 is supplied to the bit line select unit 122 for a specific time. The voltage level V2 may be lower than the voltage level V1. In response thereto, the bit line and the sense node SO are coupled, and the voltage of the bit line is sensed. Next, a sense operation is performed by supplying a second program verify voltage PV2, instead of the second program verify voltage PV2', to the word line WL<30> and supplying the bit line select signal BSL having the voltage level V2 to the bit line select unit 122 for a specific time.

After the program verify operation using the second program verify voltages PV2' and PV2 is performed as described above, a program verify operation using a third program verify voltage PV3 is performed. Here, a bit line discharge operation and a bit line precharge operation may be skipped in order to improve the speed of the program verify operation that occurs before the program verify operation using the third program verify voltage PV3 and after the program verify operation using the second program verify voltages PV2' and PV2. When the third program verify voltage PV3 is being supplied to the word line WL<30>, a sense operation is performed by supplying the bit line select signal BSL having a voltage level V2' to the bit line select unit 122 for a specific time. The voltage level V2' may be lower than the voltage level V2. In this case, because the bit line precharge operation is skipped, a gradual decrease in the voltage of the bit line due to leakage may be compensated for.

A program verify method of supplying the third program verify voltage PV3 shown in FIG. 6B is described below.

First, when the precharge signal PRECHb of a low level is supplied to the precharge unit 123, the sense node SO is precharged to a high level. Next, when the bit line select signal BSL having a voltage level V1 is supplied for a specific time, the bit line coupled to the memory cell array 110 through the sense node SO is precharged. Here, the third program verify voltage PV3 is supplied to the word line WL<30> coupled to selected memory cells (e.g., memory cells coupled to the word line WL<30>).

Next, the bit line select signal BSL shifts to a low level, and thus the connection between the sense node SO and the bit line is cut off. When the source select signal SSL of a high level is supplied, the memory cell array 110 is coupled to the ground voltage Vss. Thus, the selected memory cells (e.g., the memory cells coupled to the word line WL<30>) are turned on or turned off in response to the third program verify voltage PV3, so that the voltage of the bit line having a high level is discharged or maintained. Next, after a specific evaluation interval elapses, the bit line select signal BSL having a voltage level V2 is supplied to the bit line select unit 122 for a specific time. Accordingly, the bit line and the sense node SO are coupled, and the voltage of the bit line is sensed.

A program verify method of supplying the first to third program verify voltages PV1', PV1, PV2', PV2, and PV3 shown in FIG. 6C is described below.

When the precharge signal PRECHb of a low level is supplied to the precharge unit 123, the sense node SO is precharged to a high level. Next, when the bit line select signal BSL having a voltage level V1 is supplied for a specific time, the bit line coupled to the memory cell array 110 through the sense node SO is precharged. Here, the first program verify voltage PV1' is supplied to the word line WL<30> coupled to selected memory cells (e.g., memory cells coupled to the word line WL<30>).

Next, the bit line select signal BSL shifts to a low level, and thus the connection between the sense node SO and the bit line is cut off. When the source select signal SSL of a high level is supplied, the memory cell array 110 is coupled to the ground voltage Vss. Thus, the selected memory cells (e.g., the memory cells coupled to the word line WL<30>) are turned on or turned off in response to the first program verify voltage PV1', so that a voltage of the bit line having a high level is discharged or maintained. Next, after a specific evaluation interval elapses, the bit line select signal BSL having a voltage level V2 is supplied to the bit line select unit 122 for a specific time. In response thereto, the bit line and the sense node SO are coupled, and thus the voltage of the bit line is sensed. Next, a sense operation is performed by supplying the first program verify voltage PV1, instead of the first program verify voltage PV1', to the word line WL<30> and supplying the bit line select signal BSL having the voltage level V2 to the bit line select unit 122 for a specific time.

After the program verify operation using the first program verify voltages PV1' and PV1 is performed as described above, a program verify operation using the second program verify voltages PV2' and PV2 is performed. Here, a bit line discharge operation and a bit line precharge operation may be skipped in order to improve the speed of the program verify operation that occurs before the program verify operation using the second program verify voltages PV2' and PV2, and after the program verify operation using the first program verify voltages PV1' and PV1. When the second program verify voltage PV2' is being supplied to the word line WL<30> coupled to the selected memory cells, a sense operation is performed by supplying bit line select signal BSL having a voltage level V2' to the bit line select unit 122 for a specific time. The voltage level V2' may be lower than the voltage level V2. In this case, because the bit line precharge operation is skipped, a gradual decrease in the voltage of the bit line due to leakage, etc. can be compensated for. Next, when the second program verify voltage PV2 is being supplied to the word line WL<30> coupled to the selected memory cells, a sense operation is performed by supplying the bit line select signal BSL having the voltage level V2' to the bit line select unit 122 for a specific time.

After the program verify operation using the second program verify voltages PV2' and PV2 is performed as described above, a program verify operation using the third program verify voltage PV3 is performed. Here, a bit line discharge operation and a bit line precharge operation may be skipped in order to improve the speed of the program verify operation that occurs before the program verify operation using the third program verify voltage PV3 and after the program verify operation using the second program verify voltages PV2' and PV2. When the third program verify voltage PV3 is being supplied to the word line WL<30> coupled to the selected memory cells, a sense operation is performed by supplying the bit line select signal BSL having a voltage level V2" to the bit line select unit 122 for a specific time. The voltage level V2" may be lower than the voltage level V2'.

In program verify operations using different program verify voltages, the bit line select signal BSL having a gradually lower voltage level is supplied in order of the program verify operations as described above. Accordingly, a change in the current sense value resulting from a gradual decrease in the voltage of a bit line can be compensated for. Consequently, an increase in the width of a threshold voltage distribution when program verify operations are performed can be prevented.

Furthermore, a sense current in each interval can be identically compensated for by gradually lowering the voltage level of the bit line sense signal BSL and controlling the duration of an evaluation interval in each interval through control of a point of time at which the bit line sense signal BSL is enabled. This is described below using a program verify method of sequentially using first and second program verify voltages as an example.

When the precharge signal PRECHb of a low level is supplied to the precharge unit 123, the sense node SO is precharged to a high level. Furthermore, when the bit line select signal BSL having a voltage level V1 is supplied for a specific time, the bit line coupled to the memory cell array 110 through the sense node SO is precharged. Here, a first program verify voltage PV1' is supplied to the word line WL<30> coupled to selected memory cells (e.g., memory cells coupled to the word line WL<30>).

Next, the bit line select signal BSL shifts to a low level, and thus the connection between the sense node SO and the bit line is cut off. When the source select signal SSL of a high level is supplied, the memory cell array 110 is coupled to the ground voltage Vss. Thus, the selected memory cells (e.g., the memory cells coupled to the word line WL<30>) are turned on or turned off in response to the first program verify voltage PV1', so that a voltage of the bit line having a high level is discharged or maintained. Next, after a specific evaluation interval set for a first time elapses, the bit line select signal BSL having a voltage level V2 is supplied to the bit line select unit 122 for a specific time. In response thereto, the bit line and the sense node SO are coupled, and the voltage of the bit line is sensed. Next, a sense operation is performed by supplying a first program verify voltage PV1, instead of the first program verify voltage PV1', to the word line WL<30> and supplying the bit line select signal BSL having the voltage level V2 to the bit line select unit 122 for a specific time.

After the program verify operation using the first program verify voltages PV1' and PV1 is performed as described above, a program verify operation using second program verify voltages PV2' and PV2 is performed. Here, a bit line discharge operation and a bit line precharge operation may be skipped in order to improve the speed of the program verify operation that occurs before the program verify operation using the second program verify voltages PV2' and PV2, and after the program verify operation using the first program verify voltages PV1' and PV1. When the second program verify voltage PV2' is being supplied to the word line WL<30> coupled to the selected memory cells, a sense operation is performed by supplying the bit line select signal BSL having a voltage level V2' to the bit line select unit 122 for a specific time. Here, in order to reduce the evaluation interval of the second program verify operation, an interval where the bit line select signal BSL having the voltage level V2' is supplied during the second program verify operation is controlled so that it is shorter than an interval where the bit line select signal BSL having the voltage level V2 is supplied during the first program verify operation. In other words, a time that the bit line select signal BSL is enabled for the evaluation interval of the program verify operation using the second program verify voltages PV2' and PV2, may be shorter than the evaluation interval of the program verify operation using the first program verify voltages PV1' and PV1. The voltage level V2' may be lower than the voltage level V2. A gradual decrease in the voltage of the bit line due to leakage, etc. can be compensated for by controlling the evaluation interval and a voltage level of the bit line select signal BSL as described above.

According to the exemplary embodiments of this disclosure, in the program verify operations of a nonvolatile memory device, when the threshold voltages of memory cells are sensed by sequentially using a plurality of program verify voltages, a bit line sense signal having a gradually lower voltage level whenever the program verify voltages are changed is supplied. Accordingly, an increase in the width of a threshold voltage distribution can be prevented because a bit line sense current can be regularly maintained.

Furthermore, when program verify operations using a plurality of program verify voltages are performed, a bit line sense current can be regularly maintained by controlling the duration of an evaluation interval in each program verify operation. Accordingly, an increase in the width of a threshold voltage distribution can be prevented.

What is claimed is:

1. A program verify method of a nonvolatile memory device, comprising:
supplying a first program verify voltage to a word line coupled to memory cells of a memory cell array;
sensing a voltage of a bit line coupled to the memory cells in response to a first sense signal;
supplying a second program verify voltage higher than the first program verify voltage to the word line; and
sensing a voltage of the bit line in response to a second sense signal having a lower voltage level than the first sense signal.

2. The method of claim 1, further comprising:
supplying a third program verify voltage higher than the second program verify voltage to the word line; and
sensing a voltage of the bit line in response to a third sense signal having a lower voltage level than the second sense signal.

3. The method of claim 1, wherein sensing the voltage of the bit line is performed by coupling the bit line and a sense node of a page buffer in response to the first sense signal or the second sense signal.

4. The method of claim 1, further comprising precharging the bit line to a high level before supplying the first sense signal.

5. The method of claim 4, further comprising supplying the second sense signal without precharging the bit line.

6. The method of claim 1, further comprising supplying the second sense signal voltage with at least two voltage levels.

7. The method of claim 1, further comprising supplying the second program verify voltage for a shorter interval than the first program verify voltage.

8. A program verify method of a nonvolatile memory device, comprising:
supplying a first program verify voltage to a word line coupled to memory cells of a memory cell array;
evaluating a voltage of a bit line coupled to the memory cells according to threshold voltages of the memory cells during a first interval;
sensing the voltage of the bit line coupled to the memory cells in response to a first sense signal;

supplying a second program verify voltage higher than the first program verify voltage to the word line;

evaluating a voltage of the bit line according to threshold voltages of the memory cells during a second interval shorter than the first interval; and sensing the voltage of the bit line coupled to the memory cells in response to a second sense signal.

9. The method of claim 8, wherein the second interval is controlled by adjusting a time at which the second sense signal is enabled.

10. The method of claim 8, wherein the second sense signal has a lower voltage level than the first sense signal.

11. The method of claim 8, wherein the bit line is precharged before sensing the voltage of the bit line in response to the first signal, and the bit line is not precharged before sensing the voltage of the bit line in response to the second signal.

12. A nonvolatile memory device, comprising:

a memory cell array configured to include a plurality of memory cells;

a voltage supply unit configured to supply operating voltages to a word line of the memory cell array;

a page buffer unit coupled to the plurality of memory cells through a bit line; and a controller configured to control operations of the page buffer unit and the voltage supply unit, wherein the controller performs control so that the voltage supply unit sequentially outputs a plurality of program verify voltages to the memory cell array when program verify operations are performed and generates a bit line sense signal so that the page buffer unit senses a voltage of the bit line, and the bit line sense signal is generated having a gradually lower voltage level whenever the program verify voltages are changed.

13. The nonvolatile memory device of claim 12, wherein the controller controls durations of intervals where the bit line is evaluated by controlling times at which the bit line sense signals are enabled whenever the program verify voltages are changed.

14. The nonvolatile memory device of claim 13, wherein each interval comprising the durations of intervals decreases for each subsequent change in the program verify voltage.

* * * * *